(12) United States Patent
Hong

(10) Patent No.: US 9,846,194 B2
(45) Date of Patent: Dec. 19, 2017

(54) ELECTROSTATIC PROTECTION CIRCUIT AND SEMICONDUCTOR DEVICE INCLUDING THE SAME

(71) Applicant: SK hynix Inc., Icheon-si Gyeonggi-do (KR)

(72) Inventor: Nam Pyo Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 434 days.

(21) Appl. No.: 14/687,012

(22) Filed: Apr. 15, 2015

(65) Prior Publication Data

US 2016/0238632 A1 Aug. 18, 2016

(30) Foreign Application Priority Data

Feb. 13, 2015 (KR) ........................ 10-2015-0022150

(51) Int. Cl.
| | |
|---|---|
| *H02H 9/00* | (2006.01) |
| *G01R 31/3185* | (2006.01) |
| *G01R 31/28* | (2006.01) |
| *H01L 27/02* | (2006.01) |
| *H02H 9/04* | (2006.01) |

(52) U.S. Cl.
CPC . *G01R 31/318513* (2013.01); *G01R 31/2884* (2013.01); *H01L 27/0248* (2013.01); *H02H 9/046* (2013.01)

(58) Field of Classification Search
CPC ............................................. G01R 31/318513

USPC ........................................................... 361/56
See application file for complete search history.

(56) References Cited

U.S. PATENT DOCUMENTS

| | | | | |
|---|---|---|---|---|
| 5,703,747 A | * | 12/1997 | Voldman | H01L 23/5286 |
| | | | | 257/E23.153 |
| 7,826,193 B2 | * | 11/2010 | Perng | H01L 23/60 |
| | | | | 257/355 |
| 7,902,668 B2 | * | 3/2011 | Sato | H01L 23/60 |
| | | | | 257/738 |
| 8,045,119 B2 | * | 10/2011 | Huang | G02F 1/136204 |
| | | | | 324/760.02 |
| 8,427,797 B2 | * | 4/2013 | Charlon | H01L 23/585 |
| | | | | 361/118 |

FOREIGN PATENT DOCUMENTS

KR 101097464 B1 12/2011

* cited by examiner

*Primary Examiner* — Stephen W Jackson
(74) *Attorney, Agent, or Firm* — William Park & Associates Ltd.

(57) ABSTRACT

An electrostatic protection circuit may include a test pad configured to receive a first signal in a test mode. The electrostatic protection circuit may include a bump array configured to receive a second signal in a normal mode. The electrostatic protection circuit may include a buffer array configured to transmit the first signal or the second signal into a semiconductor device. The electrostatic protection circuit may include an electrostatic protection unit coupled with the test pad and the bump array, and configured to block static electricity included in the first signal and the second signal.

20 Claims, 3 Drawing Sheets

ELECTROSTATIC PROTECTION CIRCUIT AND SEMICONDUCTOR DEVICE INCLUDING THE SAME

CROSS-REFERENCES TO RELATED APPLICATION

The present application claims priority under 35 U.S.C. §119(a) to Korean application number 10-2015-0022150, filed on Feb. 13, 2015, in the Korean Intellectual Property Office, which is incorporated herein by reference in its entirety.

BACKGROUND

1. Technical Field

Various embodiments generally relate to a semiconductor circuit, and more particularly, to an electrostatic protection circuit and a semiconductor device including the same.

2. Related Art

A semiconductor device may include an electrostatic protection circuit for preventing an internal circuit from being damaged due to static electricity introduced through pads for external signal input.

SUMMARY

An electrostatic protection circuit, according to an embodiment, may include a test pad configured to receive a first signal in a test mode. The electrostatic protection circuit may include a bump array configured to receive a second signal in a normal mode. The electrostatic protection circuit may include a buffer array configured to transmit the first signal or the second signal into a semiconductor device. The electrostatic protection circuit may include an electrostatic protection unit coupled with the test pad and the bump array, and configured to block static electricity included in the first signal and the second signal.

According to an embodiment, a semiconductor device may include multiple chips that are stacked. One of the chips from the multiple chips that are stacked may include a plurality of bump arrays configured to input/output signals between the multiple chips that are stacked. The one stacked chip of the multiple stacked chips may include a test pad array configured to enable direct probing. The one stacked chip of the multiple stacked chips may include an electrostatic protection unit coupled with the test pad array and the plurality of bump arrays, and configured to block static electricity included in a signal inputted through the test pad array and included in a signal inputted through the plurality of bump arrays.

According to an embodiment, a semiconductor device may include multiple chips that are stacked. One of the chips from the multiple chips that are stacked may include a test pad configured to receive a first signal in a test mode. The one chip from the multiple chips that are stacked may include a bump array configured to receive a second signal in a normal mode. The one chip from the multiple chips that are stacked may include a buffer array configured to transmit the first signal or the second signal to the semiconductor device. The one chip from the multiple chips that are stacked may include an electrostatic protection unit coupled with the test pad and the bump array, and configured to block static electricity included in the first signal and the second signal.

DETAILED DESCRIPTION

Hereinafter, an electrostatic protection circuit and a semiconductor device including the same according to the present disclosure will be described below with reference to the accompanying drawings through various examples of embodiments.

Various embodiments may relate to an electrostatic protection circuit having a reduced circuit area and a semiconductor device including the same.

Figure 1:
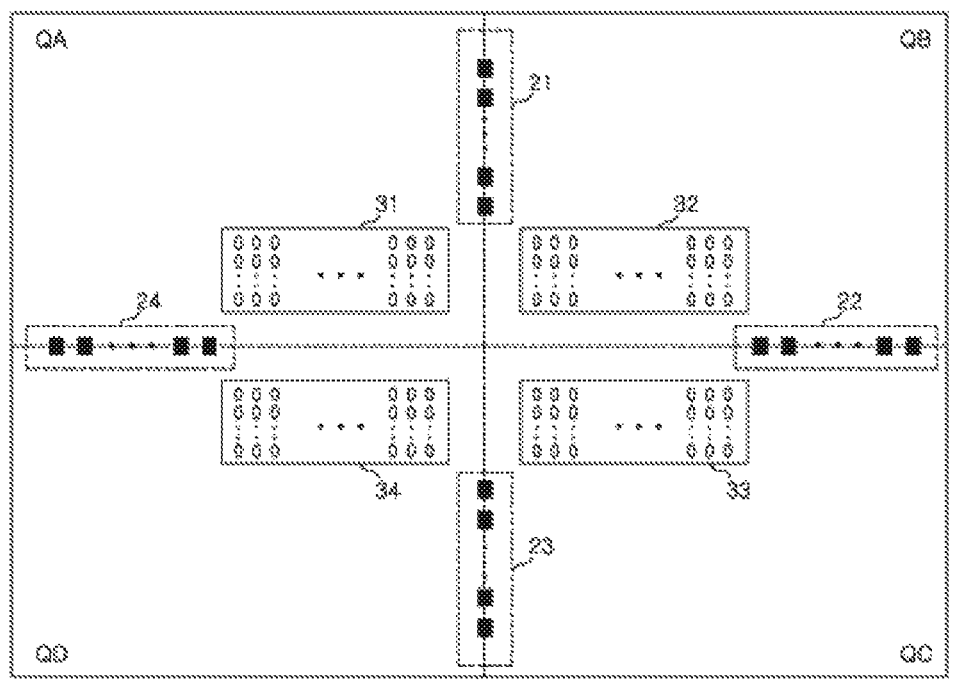
FIG. 1 is a plan view illustrating a representation of an example of the disposition of the pads of a semiconductor device in accordance with an embodiment.

Referring to FIG. 1, in an embodiment, a semiconductor device 10 may be configured to have a form including a plurality of chips that are stacked.

FIG. 1 is a plan view, illustrating a plurality of chips that are stacked. Each chip of the plurality of chips that are stacked may be divided into a plurality of regions, e.g. first to fourth regions Quadrant A (QA) to Quadrant D (QD), respectively.

The first to fourth regions QA to QD may be mutually different channels having respective memory regions.

In the first to fourth regions QA to QD, a plurality of electrode arrays, i.e. first to fourth bump arrays 31 to 34, for signal input/output between the stacked chips may be disposed therein, respectively.

For example, the first bump array 31 may be disposed in the first region QA.

For example, the second bump array 32 may be disposed in the second region QB.

For example, the third bump array 33 may be disposed in the third region QC.

For example, the fourth bump array 34 may be disposed in the fourth region QD.

Command and address input and data input/output can be achieved through each bump of the first to fourth bump arrays 31 to 34.

A plurality of test pad arrays may be disposed on one chip, e.g. the uppermost chip or the lowermost chip, other than inter-stacked chips among the plurality of chips that are stacked. The plurality of test pad arrays, e.g. first to fourth test pad arrays 21 to 24, may be configured for performing direct probing with an external test device.

Command and address input and data input/output can be performed through each test pad of the first to fourth test pad arrays 21 to 24.

Each of the first to fourth bump arrays 31 to 34 has a structure to perform direct probing with an external test device. The number of the pads included in the first to fourth bump arrays 31 to 34 may be large (e.g. 1024 pads), and it may be possible to test all the pads using a test device.

However, the first to fourth test pad arrays 21 to 24 may be formed to perform a test through direct probing with an external test device in a package state. Wherein the package state may include a plurality of chips, stacked.

Figure 2:
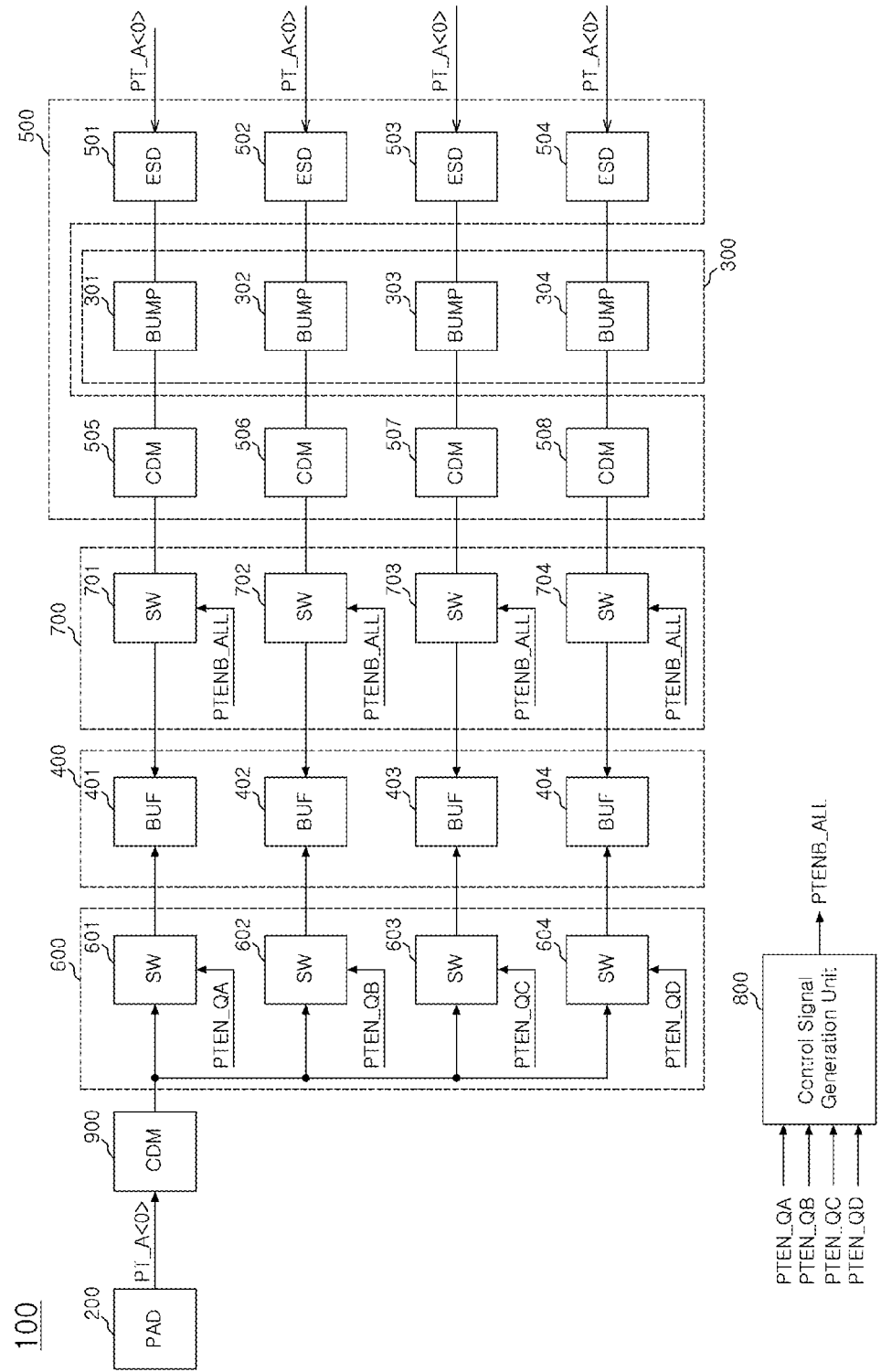
FIG. 2 is a block diagram illustrating a representation of an example of the configuration of an electrostatic protection circuit of a semiconductor device in accordance with an embodiment.

FIG. 2 is a block diagram illustrating a representation of an example of the configuration of an electrostatic protection circuit 100 of a semiconductor device in accordance with an embodiment. FIG. 2 illustrates an example of the configuration of the electrostatic protection circuit 100 for pads. The pads allocated to a normal address (e.g. A<0>), among the pads of each of the first to fourth test pad arrays 21 to 24 and the first to fourth bump arrays 31 to 34 of FIG. 1.

Referring to FIG. 2, the electrostatic protection circuit 100 of a semiconductor device in accordance with an embodiment may include a test pad 200, a bump array 300, and a buffer array 400. The electrostatic protection circuit may include an electrostatic protection unit 500 (or, for example, an electrostatic protection device 500).

The test pad 200 may be any one pad, e.g. a pad allocated to receive a test address PT_A<0>, among the first to fourth test pad arrays 21 to 24 of FIG. 1.

The bump array 300 may include first to fourth bumps 301 to 304, respectively.

The first to fourth bumps 301 to 304 may be bumps allocated to receive a normal address A<0> from the first to fourth bump arrays 31 to 34 of FIG. 1, respectively.

The first bump 301 may be a bump allocated to receive an address A<0> from the first bump array 31 of FIG. 1.

The second bump 302 may be a bump allocated to receive an address A<0> from the second bump array 32 of FIG. 1.

The third bump 303 may be a bump allocated to receive an address A<0> from the third bump array 33 of FIG. 1.

The fourth bump 304 may be a bump allocated to receive an address A<0> from the fourth bump array 34 of FIG. 1.

The buffer array 400 may be configured to transmit signals to corresponding regions in the semiconductor device. The signals may be inputted through the test pad 200 or the bump array 300.

The buffer array 400 may include a plurality of buffers, e.g. first to fourth buffers 401 to 404, respectively.

The first buffer 401 may be configured to transmit a signal, to a corresponding region in the semiconductor device. The signal may be inputted through the test pad 200 or the first bump 301. The corresponding region may be, for example, the first region QA of FIG. 1.

For example, the second buffer 402 may be configured to transmit a signal inputted through the test pad 200 or the second bump 302 to the second region QB of FIG. 1.

For example, the third buffer 403 may be configured to transmit a signal inputted through the test pad 200 or the third bump 303 to the third region QC of FIG. 1.

For example, the fourth buffer 404 may be configured to transmit a signal inputted through the test pad 200 or the fourth bump 304 to the fourth region QD of FIG. 1.

The electrostatic protection unit 500 may be configured to prevent static electricity from being introduced through the bump array 300 and the test pad 200.

The electrostatic protection unit 500 may be shared by the bump array 300 and the test pad 200.

The electrostatic protection unit 500 may include a plurality of electrostatic discharge circuits (hereinafter, referred to as "ESDs"). The ESDs may be configured such that one ends thereof are electrically coupled to the first to fourth bumps 301 to 304 in one-to-one correspondence, and the other ends thereof receive a test address PT_A<0> in common.

The electrostatic protection unit 500 may additionally include a plurality of charged device models (CDMs). The CDMs may be configured such that one ends thereof electrically coupled to the other ends of the first to fourth bumps 301 to 304 in one-to-one correspondence.

The plurality of ESDs may include first to fourth ESDs 501 to 504, respectively.

For example, the first to fourth ESDs 501 to 504 may be configured such that one ends thereof are electrically coupled to one ends of the first to fourth bumps 301 to 304 of the bump array 300 in one-to-one correspondence.

The first to fourth ESDs 501 to 504 may be configured to receive, through the other ends thereof in common, an input signal, i.e., test address PT_A<0>, generated through the test pad 200.

The plurality of CDMs may include, for example, first to fourth CDMs 505 to 508, respectively.

The first to fourth CDMs 505 to 508 may be configured such that one ends thereof are electrically coupled to the other ends of the first to fourth bumps 301 to 304 of the bump array 300 in one-to-one correspondence.

The sizes of the first to fourth ESDs 501 to 504 and the first to fourth CDMs 505 to 508 may be determined by taking into consideration the maximum amount of static electricity which can be introduced through each of the first to fourth bumps 301 to 304.

The test pad 200 may be designed to have a size so that direct probing by a test device can be performed. The size of the test pad 200 may be, for example, a larger size than each of the first to fourth bumps 301 to 304.

Consequently, the maximum amount of static electricity to be introduced through the test pad 200 may be more than the amount of static electricity introduced through each of the first to fourth bumps 301 to 304.

Therefore, when the first to fourth ESDs 501 to 504 are configured to receive a test address PT_A<0> in common, static electricity introduced through the test pad 200 can be prevented from being introduced into the semiconductor device through the buffer array 400.

The electrostatic protection circuit 100 for a semiconductor device in accordance with an embodiment may additionally include a selection unit 600 (or, for example, a selection device 600), an input blocking unit 700 (or, for example, an input blocking device 700), and a control signal generation unit 800 (or, for example, a control signal generation device 800).

The selection unit 600 may be configured to transmit a test address PT_A<0> inputted through the test pad 200. The selection unit 600 may be configured to transmit the test address PT_A<0> to any one of the first to fourth buffers 401 to 404 of the buffer array 400. The test address PT_A<0> may be transmitted by the selection unit 600 in response to a plurality of selection signals. The selection signals may include, for example, first to fourth selection signals PTEN_QA to PTEN_QD, respectively.

The first to fourth selection signals PTEN_QA to PTEN_QD may be provided from an exterior, e.g. a test device, in a test mode, i.e. a package test mode.

One or more of the first to fourth selection signals PTEN_QA to PTEN_QD may be simultaneously activated while operating in a test mode.

The selection unit 600 may include a plurality of switches, i.e. first to fourth switches 601 to 604, respectively.

For example, the first switch 601 may be configured to transmit the test address PT_A<0> to the first buffer 401 in response to the first selection signal PTEN_QA.

For example, the second switch 602 may be configured to transmit the test address PT_A<0> to the second buffer 402 in response to the second selection signal PTEN_QB.

For example, the third switch 603 may be configured to transmit the test address PT_A<0> to the third buffer 403 in response to the third selection signal PTEN_QC.

For example, the fourth switch 604 may be configured to transmit the test address PT_A<0> to the fourth buffer 404 in response to the fourth selection signal PTEN_QD.

The input blocking unit 700 may be configured to cut off or prevent electrical coupling between the buffer array 400, the electrostatic protection unit 500, and the bump array 300, in response to a control signal PTENB_ALL.

The input blocking unit 700 may include a plurality of switches, i.e. fifth to eighth switches 701 to 704, respectively.

For example, the fifth switch 701 may be configured to cut off or prevent electrical coupling between the first buffer 401 and the first CDM 505 of the electrostatic protection unit 500 in response to the control signal PTENB_ALL.

For example, the sixth switch 702 may be configured to cut off or prevent electrical coupling between the second buffer 402 and the second CDM 506 of the electrostatic protection unit 500 in response to the control signal PTENB_ALL.

For example, the seventh switch 703 may be configured to cut off or prevent electrical coupling between the third buffer 403 and the third CDM 507 of the electrostatic protection unit 500 in response to the control signal PTENB_ALL.

For example, the eighth switch 704 may be configured to cut off or prevent electrical coupling between the fourth buffer 404 and the fourth CDM 508 of the electrostatic protection unit 500 in response to the control signal PTENB_ALL.

The control signal generation unit 800 may be configured to generate the control signal PTENB_ALL in response to the first to fourth selection signals PTEN_QA to PTEN_QD.

The control signal generation unit 800 may be configured to activate the control signal PTENB_ALL when one or more of the first to fourth selection signals PTEN_QA to PTEN_QD are activated.

The control signal generation unit 800 may be configured to perform a logic function and may include a logic gate or gates. For example, the control signal generation unit 800 may be configured with a NOR logic.

In a normal operation, the buffer array 400 may input a normal address A<0>, inputted through the bump array 300, to each of the first to fourth regions QA to QD.

In a test mode, signal input through the bump array 300 is unavailable.

In order to block static electricity of the test address PT_A<0> inputted through the test pad 200, the test address PT_A<0> inputted through the first to fourth ESDs 501 to 504 may be inputted to the first to fourth buffers 401 to 404 of the buffer array 400.

In a test mode, when the test address PT_A<0> is inputted to the first to fourth buffers 401 to 404, a normal test may not be achieved.

Therefore, in a test mode, i.e. when the control signal PTENB_ALL is activated, the input blocking unit 700 may block a test address PT_A<0>, inputted through the first to fourth ESDs 501 to 504, from being inputted to the buffer array 400.

A CDM 900 may be electrically coupled between the test pad 200 and the selection unit 600.

Hereinafter, the operation of a semiconductor device in accordance with an embodiment will be described.

First, it is assumed that the first selection signal PTEN_QA of the first to fourth selection signals PTEN_QA to PTEN_QD is activated in a test mode.

As the first selection signal PTEN_QA is activated, a test address PT_A<0> inputted through the test pad 200 is inputted to the first region QA via the first switch 601 and the first buffer 401.

Static electricity included in the test address PT_A<0> may be eliminated by simultaneous operation of the first to fourth ESDs 501 to 504.

As the first selection signal PTEN_QA is activated, a control signal PTENB_ALL is activated.

As the control signal PTENB_ALL is activated, the input blocking unit 700 blocks the signal paths between the buffer array 400 and the first to fourth ESDs 501 to 504 to achieve a normal test.

In a normal mode, a test address PT_A<0> is not inputted through the test pad 200, and the first to fourth selection signals PTEN_QA to PTEN_QD are all inactivated.

Since the first to fourth selection signals PTEN_QA to PTEN_QD are all inactivated, the selection unit 600 blocks the signal paths between the test pad 200 and the buffer array 400.

Since all of the first to fourth selection signals PTEN_QA to PTEN_QD are in an inactivated state, the control signal PTENB_ALL is maintained in an inactivated state, as well.

Since the control signal PTENB_ALL is in an inactivated state, the input blocking unit 700 electrically couples the signal paths between the buffer array 400 and the first to fourth ESDs 501 to 504.

A signal inputted through any one of the first to fourth bumps 301 to 304 may be transmitted, through any one of the first to fourth buffers 401 to 404 corresponding thereto, to any one of the first to fourth regions QA to QD of a corresponding chip and another chip.

Static electricity included in the signal inputted through any one of the first to fourth bumps 301 to 304 may be eliminated through any one of the first to fourth ESDs 501 to 504 corresponding thereto.

Figure 3:
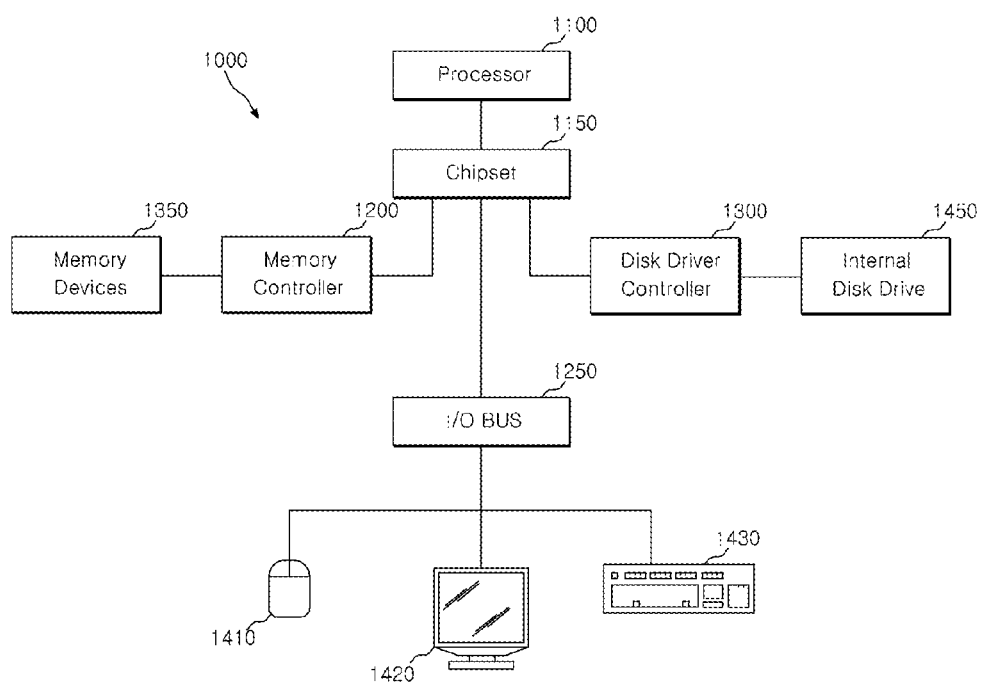
FIG. 3 illustrates a block diagram of an example of a representation of a system employing a electrostatic protection circuit and/or semiconductor device in accordance with the various embodiments discussed above with relation to FIGS. 1-2.

The electrostatic protection circuits and/or semiconductor devices discussed above (see FIGS. 1-2) are particular useful in the design of memory devices, processors, and computer systems. For example, referring to FIG. 3, a block diagram of a system employing the electrostatic protection circuits and/or semiconductor devices in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one electrostatic protection circuit and/or semiconductor device as discussed above with reference to FIGS. 1-2. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one electrostatic protection circuit and/or semiconductor device as discussed above with relation to FIGS. 1-2, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 3 is merely one example of a system employing the electrostatic protection circuit and/or semiconductor device as discussed above with relation to FIGS. 1-2. In alternate embodiments, such as cellular phones or digital cameras, the components may differ from the embodiments illustrated in FIG. 3.

While certain embodiments have been described above, it will be understood to those skilled in the art that the embodiments described are by way of example only. Accordingly, the circuit and device described herein should not be limited based on the described embodiments. Rather, the circuit and device described herein should only be limited in light of the claims that follow when taken in conjunction with the above description and accompanying drawings.

What is claimed is:

1. An electrostatic protection circuit comprising:
   a test pad configured to receive a first signal in a test mode;
   a bump array configured to receive a second signal in a normal mode;
   a buffer array configured to transmit the first signal or the second signal into a semiconductor device; and
   an electrostatic protection unit coupled with the test pad and the bump array, and configured to block static electricity included in the first signal and the second signal.

2. The circuit according to claim 1, wherein the electrostatic protection unit comprises a plurality of electrostatic discharge (ESD) circuits electrically coupled to the bump array.

3. The circuit according to claim 1, wherein:
   the bump array comprises a plurality of bumps; and
   the electrostatic protection unit comprises a plurality of ESD circuits each configured to have one end electrically coupled to one end of the plurality of bumps, respectively, in one-to-one correspondence, and to respectively have other ends configured to receive the first signal in common.

4. The circuit according to claim 1, wherein:
   the bump array comprises a plurality of bumps; and
   the electrostatic protection unit comprises
   a plurality of ESD circuits each configured to have one end electrically coupled to one end of the plurality of bumps, respectively, in one-to-one correspondence, and to respectively have other ends configured to receive the first signal in common, and
   a plurality of charged device models (CDMs) each configured to have one end electrically coupled to other ends of the plurality of bumps, respectively, in one-to-one correspondence.

5. The circuit according to claim 1, further comprising:
   a selection unit configured to selectively transmit the first signal to a plurality of buffers of the buffer array in response to a plurality of selection signals.

6. The circuit according to claim 1, further comprising:
   an input blocking unit configured to prevent electrical coupling between the buffer array and the electrostatic protection unit in response to a control signal.

7. The circuit according to claim 5, further comprising a control signal generation unit configured to generate the control signal in response to a plurality of selection signals.

8. The circuit according to claim 1, further comprising:
   a selection unit configured to selectively transmit the first signal to a plurality of buffers of the buffer array in response to a plurality of selection signals; and
   an input blocking unit configured to prevent electrical coupling between the buffer array and the electrostatic protection unit when a control signal is activated, and to electrically couple the buffer array and the electrostatic protection unit to each other when the control signal is inactivated.

9. The circuit according to claim 8, further comprising a control signal generation unit configured to activate the control signal when one or more of the plurality of selection signals are activated.

10. A semiconductor device comprising multiple chips that are stacked, wherein one chip from the multiple chips that are stacked comprises:
    a plurality of bump arrays configured to input/output signals between the multiple chips that are stacked;
    a test pad array configured to enable direct probing; and
    an electrostatic protection unit coupled with the test pad array and the plurality of bump arrays, and configured to block static electricity included in a signal inputted through the test pad array and in a signal inputted through the plurality of bump arrays.

11. The semiconductor device according to claim 10, wherein the one chip of the multiple chips that are stacked is a chip other than inter-stacked chips of the multiple chips that are stacked.

12. The semiconductor device according to claim 10, wherein each of the multiple chips that are stacked comprises a plurality of channels.

13. The semiconductor device according to claim 10, wherein the electrostatic protection unit comprises a plurality of electrostatic discharge (ESD) circuits, and
    the plurality of ESD circuits each configured to respectively have one end electrically coupled to one end of the plurality of bumps of the plurality of bump arrays in one-to-one correspondence, and to enable a predetermined unit number of ESD circuits to receive a signal inputted through each test pad of the test pad array in common.

14. The semiconductor device according to claim 10, further comprising:
a buffer array configured to transmit a signal inputted through the test pad array or a signal inputted through the plurality of bump arrays into the semiconductor device;
a selection unit configured to selectively transmit a signal, inputted through the test pad array, to multiple buffers of the buffer array in response to a plurality of selection signals; and
an input blocking unit configured to prevent electrical coupling between the buffer array and the electrostatic protection unit when a control signal is activated, and to electrically couple the buffer array and the electrostatic protection unit to each other when the control signal is inactivated.

15. The semiconductor device according to claim 14, further comprising a control signal generation unit configured to activate the control signal when one or more of the plurality of selection signals are activated.

16. A semiconductor device comprising multiple chips that are stacked, wherein one chip from the multiple chips that are stacked comprises:
a test pad configured to receive a first signal in a test mode;
a bump array configured to receive a second signal in a normal mode;
a buffer array configured to transmit the first signal or the second signal to the semiconductor device; and
an electrostatic protection unit coupled with the test pad and the bump array, and configured to block static electricity included in the first signal and the second signal.

17. The semiconductor device according to claim 16, wherein the one chip of the multiple chips that are stacked is an uppermost chip or a lowermost chip of the multiple chips that are stacked.

18. The semiconductor device according to claim 16, wherein:
the bump array comprises a plurality of bumps; and
the electrostatic protection unit comprises a plurality of ESD circuits each configured to have one end electrically coupled to one end of the plurality of bumps, respectively, in one-to-one correspondence, and to respectively have other ends configured to receive the first signal in common.

19. The semiconductor device according to claim 16, further comprising:
a selection unit configured to selectively transmit the first signal to a plurality of buffers of the buffer array in response to a plurality of selection signals; and
an input blocking unit configured to prevent electrical coupling between the buffer array and the electrostatic protection unit when a control signal is activated, and to electrically couple the buffer array and the electrostatic protection unit to each other when the control signal is inactivated.

20. The semiconductor device according to claim 19, further comprising a control signal generation unit configured to activate the control signal when one or more of the plurality of selection signals are activated.

* * * * *